United States Patent [19]

Kisters et al.

[11] Patent Number: 4,751,105
[45] Date of Patent: Jun. 14, 1988

[54] METHOD FOR PRODUCING CIRCUIT BOARDS

[75] Inventors: Günter Kisters, Issum; Fritz Stahl, Tönisvorst, both of

[73] Assignee: Kollmorgen Corporation, Simsbury, Conn.

[21] Appl. No.: 558,710

[22] Filed: Dec. 7, 1983

Related U.S. Application Data

[63] Continuation of Ser. No. 234,747.

[30] Foreign Application Priority Data

Feb. 19, 1980 [DE] Fed. Rep. of Germany ....... 3006117

[51] Int. Cl.$^4$ .............................................. B05D 5/12
[52] U.S. Cl. ........................................ 427/98; 427/96; 427/97
[58] Field of Search ........................................... 427/98

[56] References Cited

U.S. PATENT DOCUMENTS

| | | | |
|---|---|---|---|
| 3,226,256 | 12/1965 | Schneble, Jr. et al. | 427/98 |
| 3,350,498 | 10/1967 | Leeds | 427/98 |
| 3,672,986 | 6/1972 | Schneble, Jr. et al. | 427/98 |
| 3,697,319 | 10/1972 | Feldstein | 427/98 |
| 4,005,238 | 1/1977 | Gaehde | 427/307 |
| 4,152,477 | 5/1979 | Haruta | 427/98 |

FOREIGN PATENT DOCUMENTS

| | | | |
|---|---|---|---|
| 52-8504 | 3/1977 | Japan | 427/98 |
| 53-88960 | 8/1978 | Japan | 427/98 |

OTHER PUBLICATIONS

Haining et al., "Multilayer Circuit", IBM TDB, vol. 11, No. 10, Mar., 1969, p. 1320.

Primary Examiner—Shrive P. Beck
Assistant Examiner—Vi Duong Dang
Attorney, Agent, or Firm—Morgan & Finnegan

[57] ABSTRACT

A method for producing circuit boards in which a plurality of planar circuit board bases having a circuit pattern thereon are interconnected at predetermined points. The method includes the steps of applying a mask over the circuit pattern on a base leaving, at the points to be interconnected, a window in the mask; applying an adhesive coating over the mask with the adhesive coating extending over the mask windows and onto the circuit pattern metal to form a second smaller window; treating and depositing metal on said adhesive coating to form a second circuit pattern on the plane of said adhesive and interconnecting the second circuit pattern with the first circuit pattern at said second windows; and, repeating said steps until a circuit board of the desired number of planar circuit patterns is produced.

12 Claims, No Drawings

METHOD FOR PRODUCING CIRCUIT BOARDS

This is a continuation, of application Ser. No. 234,747 filed Feb. 17, 1981 now abandoned.

This invention relates to a method for producing circuit boards and more particularly to a method for producing such boards having circuit patterns on two or more planes.

It is well known to manufacture circuit boards with circuit patterns on the opposite sides of a board base composed of insulating material. In connection with such circuit boards, known under the term "double-sided circuit boards with through-plated punched-hole connections," the circuit pattern conductors disposed on opposite sides of the board and forming a current path are interconnected through metallized walls of punched holes provided throughout the insulating base or substrate. The metal coating on the metallized walls of the holes are provided in a way that the metal forms an electrical connection between the respective circuit patterns.

It has heretofore been proposed to produce multi-plane circuits from a plurality of thin insulating substrates, supporting on their surfaces circuit patterns, by a method of pressing under heat. The connection between the circuit pattern conductors disposed on different planes is established in such multiplane circuit boards by means of punched holes provided at the respective points of connection. The walls of such punched holes are provided with a metallic coating which form the electrical connection between the respective circuit patterns. In a variation of the process, the walls of the holes are not only metallized, but the holes themselves are filled with metal.

The use of holes filled with metal or of holes with metallized walls as interconnections between the circuit patterns on different planes of a multi-plane circuit board has the disadvantage that the interconnections between the circuit patterns on the surfaces of the circuit boards within the multi-plane complex are unavailable for additional connections, independent mounting holes, contact areas for connecting surface-connected components, and the like. This means that large areas of the circuit patterns are consumed, or unavailable for connections, mounting holes, components, and the like. This leads to the necessity for making the circuit boards larger in size. Such larger size is undesirable not only from the standpoint of cost, but also because of the use of highly integrated components and the increasing trend in miniaturization. The advantages of integrated components and miniaturization are lost.

It has been proposed to interconnect the circuit patterns on multi-plane circuit boards with connecting hole perforations with small diameters. However, this results in making the process for producing such holes much more complicated and the formation of a reliable metallization of the walls of the holes more difficult without bringing the problem to a fully satisfactory solution.

It has also been proposed to produce multi-plane circuit boards in a manner such that a masking layer is applied after the preparation of the conductor pattern on the first plane, the masking layer leaving those points exposed at which electrical connections are desired between the conductor pattern of the first and the conductor of the next-following plane. The exposed points permit the formation or build-up of interconnections between the conductor patterns on the first and second conductor pattern planes in the known manner by currentless metal deposition. The interconnection between the conductor patterns of subsequent layers is effected by the application of such a masking layer, with electrical connection points exposed, on each layer before the next conductor pattern plane is applied. Interconnections between the conductor patterns are then built up during subsequent currentless deposition at the exposed connection points.

It has been found that this masking method is not suitable for producing reliable contact connections capable of withstanding mechanical and thermal stresses.

It is the objective of the method of the instant invention to produce, in an economical and space-saving manner, circuit boards in which the connections between conductor patterns disposed on successively arranged planes are formed without the use of holes with metallized walls. The multi-plane circuit boards so produced are interconnected between the circuit patterns on successively arranged planes in an improved and novel manner.

According to the method of the present invention, the conductor pattern on the first plane of conductor pattern planes to be laminated by heat and pressure is prepared on the surface of a dielectric material suitable for laminating using one of the known preparation methods. Subsequently, the surface is coated or covered with a masking layer composed of insulating material, leaving exposed only those points on the conductor pattern which, later in the process, will serve for interconnecting the corresponding, matching circuit pattern of the first plane with the next and following plane. Such exposed or uncovered points are referred to herein as "first windows". Subsequently, a layer of adhesive material is applied to cover the surface of the mask at least in those zones in which the pattern of conductor trains of the second plane is to be formed and in such a way that the adhesive coating extends over the edges of the first windows and onto the surface of the conductor patterns not covered by the mask, thus leaving a second, smaller uncovered window. The adhesive coated board is treated with a decomposing agent which renders the surface zones microporous and polar and, at the same time, wettable. The circuit pattern of the second plane is subsequently formed on the surface layer so prepared by known electroless or currentless metal deposition methods alone or combined with a galvanic metal-depositing process. During such formation of the circuit pattern of the second plane the metal coating or metallic conductor is formed extending in a uniform layer up to the second window and cover with solid adhesion the exposed surface of the corresponding circuit pattern of the first plane.

If it is intended to use in excess of two planes of conductor patterns the steps of the method of the present invention are repeated for a number of times corresponcing to the number of planes.

It has been discovered that it is particularly advantageous as the adhesive layer a coating containing an additive capable of rendering said layer catalytic for the currentless metal deposition either fully or at least on its surface. Suitable catalytic additions are, for example, organometallic compounds of a metal selected from Groups 1B and VIII. The use of the adhesive coating on the dielectrical insulating layer in accordance with the instant invention, permits the production of circuit boards which are suitable for practical applications and satisfy the requirements for mechanical and thermal stresses. Such circuit boards are compact and durable.

It has been discovered that the manufacture of such circuit boards requires that the adhesive coating extend beyond the edges of the windows formed in the dielectrical masking layer and up onto the exposed metal surface of the circuit pattern of the first circuit plane pattern conductor plane, with said adhesive coating leaving exposed a second, smaller window. This permits the build-up of the metal coating on the second conductor plane which forms the second plane conductor pattern and also the connection at designated connector points to the conductor pattern of the first plane in an operational reliable way.

If punched or drilled holes are to be used for mounting components with connecting leads, said holes may be provided in known manner with a metal coating on the walls of the hole for enhancing the properties of the soldered junction.

According to the instant invention, such circuit boards having holes with metallized walls can be manufactured in a particularly simple way if use is made both of an adhesive material having a catalyzing effect for the currentless deposition of the metal, and an initial material provided with a catalyzing additive.

According to a further variation of the instant invention connecting holes with metallized walls may be used for connecting, in a known manner, circuit patterns disposed on opposide sides of the initial material. Since all or the majority of the connections between connector patterns disposed on different planes are formed without holes with metallized walls, the economical exploitation of the surface of the circuit boards and their excellent operational reliability are fully retained.

The first plane or planes of conductor patterns are used for building up conductor patterns with relatively low density. Such patterns are produced, for example, by the screen printing method. The following plane or planes are then used for building up patterns of conductor patterns with high density which, if need be, may be produced by photo printing. In this way, it is possible to use different methods for the manufacture of conductor patterns for circuit boards with circuit patterns disposed on only two or on a plurality of planes and gain, through the use of the less costly screen printing method, a layer or layers with low conductor pattern density. This provides an extremely economical production process.

For producing the microporous, polar and wettable region of the surface of the adhesive layer, the method according to the present invention employs an agent which does not attack the metal of the circuit pattern or attacks the metal only to a very limited degree. The use of an alkaline permanganate solution was found to be particularly useful where the circuit pattern is of copper.

Advantageously, the dielectrical masking layer is applied in the form of a resin coating having a dry coating film thickness of from 30 to 100 μm. Particularly suitable are epoxy resin mixtures or mixtures comprising epoxy and phenolic resins Preferred the thickness of the dry film is 50 μm.

Suitable adhesive coatings found useful in the practice of the instant invention are, for example, two-phase resin systems containing a component causing under the influence of a suitable medium the formation of micropores.

Test carried out by applicant have shown that the area of the second window zone, thus of the window in the adhesive coating, has advantageously a size of about 0.1 to about 1 sq.mm, preferably a size of at least 0.5 sq.mm.

The method according to the present invention is explained in greater detail with the help of the following examples:

EXAMPLE 1

The initial material used for a circuit board with conductor patterns disposed on two planes is a commercially available dielectric base material clad with copper on one side. After cutting the board to size, the cleaned copper surface is provided with a covering mask conforming with the desired conductor pattern such as, for example, by using the screen printing process. Following the etching step and removal of the masking layer, the circuit board provided with the desired conductor pattern on the first plane is inspected. A permanent masking layer composed of dielectric insulating material is applied to the inspected first plane. This is achieved by applying a epoxy resin mixture by means of screen printing, leaving windows exposed on the circuit pattern where interconnection is to be made. The size of such windows is selected slightly larger than the size of the areas required for forming the interconnection. After curing the resin mixture for about 1 hour at about 120° C., a dry film thickness of 50 μm is obtained.

Next, an adhesive coating, composed of a phenolic resin modified with butadiene nitrile rubber and containing an organo-metallic compound of palladium is applied by screen printing. The adhesive coating is applied to and extends beyond the edges of the windows provided in the dielectric masking layer and onto the metal surface of the circuit pattern, leaving a second window having a smaller area than the first window. The area of the second window so formed has a size of 0.5 sq.mm in the present example.

Subsequently, the adhesive coating is cured for 40 minutes at 160° C. and exposed for 1 to 3 minutes at 50° to 60° C. to an alkaline permanganate solution which forms a micropore, as well as a polar, wettable surface on the cured adhesive coating. Such alkaline solution contains 40 to 60 grams/liter potassium permanganate and 40 to 60 grams/liter sodium hydroxide.

After washing with water, diluted hydrochloric acid and again water, the exposed copper surfaces in the second windows are briefly cleaned in an ammonium persulfate solution at 30° to 40° C. This solution contains between 100 and 250 grams/liter ammonium persulfate.

After washing with water, diluted hydrochloric acid and again water a metal coating covering both the surface of the adhesive layer and the copper surfaces in the second windows is deposited in a bath for electroless or currentless precipitation or deposition of copper. The thickness of the electroless copper coating thus deposited is selected in the range of 0.5 and 2.5 μm.

A masking layer corresponding with the negative of the conductor pattern desired for the second plane is applied by photo printing and the conductor is built up in a galvanic bath with high leveling capability.

The circuit boards are finished by printing with solder stop paint and punched from the work board.

EXAMPLE 2

The procedure specified in example 1 is followed to the application and curing of the adhesive coating. Following the curing step a mask corresponding with the negative of the circuit pattern desired on the second plane is imprinted, the mask again leaving exposed the second windows. The adhesive coating is subsequently treated with the potassium permanganate solution and the work board admitted after the washing steps into a bath for the currentless precipitation or electroless deposition of copper. The board remains in the bath until the conductor pattern has formed to the desired thickness. Following washing, a mask of solder stop paint is applied and cured and the circuit boards are subsequently punched from such work board.

EXAMPLE 3

For producing a circuit board with four planes of conductor patterns the procedure defined in example 1 or 2 is first followed. Prior to the application of the solder stop paint mask the following process steps are repeated two additional times:
application and curing of the dielectric masking layer;
application and curing of the adhesive layer;
treatment with the potassium permanganate solution; and
build-up of the patterns of conductors on the respective plane.

EXAMPLE 4

The method is based in the present example on a dielectric base material which is clad with copper on both sides and which contains fully dispersed therein a substance for catalytically sensitizing the surfaces of said base material for the currentless metal precipitation. It was found that an addition suitable for said purpose is an organometallic compound of palladium, which is added to the resin mixture used for producing the base material.

First, the circuit pattern of the first two planes of conductor patterns are produced in known manner on the opposite sides of the base material. Subsequently, each of the two surfaces supporting the conductor patterns are provided - as specified in example 1—with the dielectric and adhesive coatings. Through-extending holes are subsequently prepared points at which the conductor patterns disposed on the opposite side of the base are to be interconnected. Subsequently, the walls of the holes are built up together with the patterns of conductors of the second planes as specified in examples 1, 2 or 3, and the circuit board is finished.

EXAMPLE 5

The method is based in the present example on a dielectric base material supporting, instead of a copper cladding, an adhesive coating. The first plane of the circuit pattern is subsequently completely structured or developed in the known way by means of currentless or electroless metal deposition or such metal deposition combined with subsequent galvanic metal precipitation, in order to then proceed in the way specified in one of examples 1 to 4, incl.

EXAMPLE 6

The initial material used is a dielectric base material clad on one side with copper. Such base material is first provided with the pattern of conductor patterns of the first plane and subsequently, as specified in example 1, with the dielectric masking layer and the adhesive coating. However, in contrast to example 1, the adhesive coating used in the present example contains no addition for catalyzing the currentless deposition of metal.

Following the treatment with the potassium permanganate solution, the board is exposed to catalytic sensitizing bath solution which sensitizes the board for the currentless metal deposition. In the present case, the solution used contained the reaction product of palladium (II) chloride and tin (II) chloride.

The method was then continued again as specified in example 1.

The method of the instant invention, as exemplified by the foregoing examples and description, produces efficiently and economically a multi-plane circuit board in which the circuit patterns on the respective planes are interconnected in a manner durable to both mechanical and thermal shock.

The terms and expressions which have been employed are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. In a method for producing printed circuit boards having at least two planes of conductor patterns, in the course of which method there is first prepared the conductor pattern of the first plane which is subsequently provided with a layer of insulating mask, leaving exposed those points of the conductor patterns of the first plane for build up of connections with the corresponding conductor patterns of a next-following plane of conductor patterns, and there are subsequently prepared the conductor patterns of the second plane by an action of metal deposition, in the course of which metal deposition the simultaneously formed metal deposition coating causes at the exposed points not covered by the masking layer and hereinafter referred to as the "first window" of the conductor patterns of the first plane of conductor patterns, interconnects the corresponding conductor patterns of the two planes at each of said windows in said conductor patterns, characterized by the fact that following the application and drying of the insulation mask layer there is applied over such mask layer a layer of a butadiene nitrile rubber modified phenolic resin adhesive capable of being rendered microporous, polar and wettable by a subsequent treatment, said adhesive layer being applied across the edges of each of the said first windows in the masking layer and onto the metal surface of the respective conductor patterns but leaving, at each of said first windows, a second, smaller window on the exposed metal surface of the conductor patterns, subsequently treating said adhesive layer with an alkaline permanganate solution and rendering said adhesive layer microporous and wettable without attacking the metal of the conductor patterns to any interfering extent and depositing on said treated adhesive layer and the exposed metal surface of the conductor patterns a metal deposition to form a second conductor pattern on said adhesive layer interconnected at said second, smaller windows to the first conductor patterns.

2. The method, as defined in claim 1, characterized by the fact that the second window zone has an opening having a size of at least from about 0.1 to about 1 sq.mm.

3. The method, as defined in claim 2, characterized by the fact that the size of the second window opening is at least 0.5. sq.mm.

4. The method, as defined in any one of claims 1 to 3, characterized by the fact that the dry film of the masking layer composed of dielectric material is present with a thickness of from 30 to 100 μm.

5. The method, as defined in any one of claims 1 to 3, characterized by the facts that the dry film of the masking layer composed of dielectric material is present with a thickness of from 30 to 100 μm and the adhesive layer has a thickness of from 10 to 50 μm.

6. The method, as defined in any one of claims 1 to 3, characterized by the facts that the dry film of the masking layer composed of dielectric material is present with a thickness of from 30 to 100 μm, the adhesive layer has a thickness of from 10 to 50 μm and the masking layer has a thickness of 50 μm and the adhesive layer has a thickness of 20 μm.

7. The method, as defined in any one of claims 1 to 3, characterized by the facts that the dry film of the masking layer composed of dielectric material is present with a thickness of from 30 to 100 μm, the adhesive layer has a thickness of from 10 to 50 μm, the masking layer has a thickness of 50 μm, the adhesive layer has a thickness of 20 μm and the adhesive layer contains a substance for catalytically initiating on its surface the currentless depositon of metal from metal bath solutions.

8. The method, as defined in any one of claims 1 to 3, characterized by the fact that the electroless formed layer is first reinforced galvanically and that a galvanic bath with high leveling capability is used for building up the conductor patterns.

9. The method, as defined in any one of claims 1 to 3, characterized by the fact that all planes of conductor patterns are arranged exclusively on one side of the initial material for the circuit board and that in the step of galvanic metal deposition two circuit boards are in each case disposed with their sides free of conductor patterns facing each other.

10. The method, as defined in at least one of claims 1 to 3, characterized by the fact that holes with metallized hole walls are prepared simultaneously with the build-up of the conductor patterns of one plane and the connection to the conductor patterns of the next plane, said holes serving as holes for mounting components or as the connection of circuit patterns disposed on different sides of the initial material or for both said purposes.

11. The method, according to at least one of claims 1 to 3, characterized by the fact that conductor patterns with a relative low density are used for the planes of conductor patterns disposed adjacent the surface of the initial material, and that a higher density of conductor patterns is selected for the next plane or for a number of planes of conductor patterns exceeding two and built up in each case later.

12. The method, as defined in claim 11, characterized by the fact that the conductor patterns having the lower density are produced by screen printing and those having a high density by means of photoprinting.

* * * * *